(12) United States Patent
Zhang et al.

(10) Patent No.: US 10,119,997 B2
(45) Date of Patent: Nov. 6, 2018

(54) METHOD FOR MEASURING THE WAVEFORM CAPTURE RATE OF A DIGITAL STORAGE OSCILLOSCOPE BASED ON AVERAGE DEAD TIME MEASUREMENT

(71) Applicant: UNIVERSITY OF ELECTRONIC SCIENCE AND TECHNOLOGY OF CHINA, Chengdu, Sichuan (CN)

(72) Inventors: Qinchuan Zhang, Chengdu (CN); Kuojun Yang, Chengdu (CN); Lianping Guo, Chengdu (CN); Hao Zeng, Chengdu (CN); Jia Zhao, Chengdu (CN); Jinpeng Song, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 133 days.

(21) Appl. No.: 15/146,227

(22) Filed: May 4, 2016

(65) Prior Publication Data
US 2017/0003328 A1    Jan. 5, 2017

(30) Foreign Application Priority Data

Jun. 30, 2015  (CN) .......................... 2015 1 0372830

(51) Int. Cl.
*G01R 13/02*         (2006.01)
(52) U.S. Cl.
CPC ..... *G01R 13/0272* (2013.01); *G01R 13/0254* (2013.01)

(58) Field of Classification Search
CPC .................................................. G01R 13/0272
USPC ............................................................. 702/67
See application file for complete search history.

(56) References Cited

U.S. PATENT DOCUMENTS

| 5,438,531 A * | 8/1995 | Shank ................. G01R 13/345 708/313 |
| 6,311,138 B2 | 10/2001 | Miller |
| 9,523,717 B2 * | 12/2016 | Zeng ................. G01R 13/0272 |
| 2005/0273248 A1 | 12/2005 | Artini |
| 2014/0188419 A1 | 7/2014 | Zeng et al. |

FOREIGN PATENT DOCUMENTS

CN          101281224 B     6/2011

\* cited by examiner

*Primary Examiner* — Marc Armand
(74) *Attorney, Agent, or Firm* — Oliff PLC

(57) ABSTRACT

A method for measuring waveform capture rate (WRC) of DSO based on average dead time measurement. First generating ramp signal or symmetric triangular wave signal as base signal, a trigger signal, the frequency which is higher than the nominal maximum waveform capture rate of the DSO under measurement; secondly, setting the parameters of DSO for measuring; then obtaining a plurality of test signals by delaying base signal K times with different delay time, for each test signal, inputting it the trigger signal simultaneously to DSO, calculating dead time between two adjacent captured waveforms according to their initial voltages, finally calculating waveform capture rate based on average dead times. The waveform capture rate obtained can effectively reflect the overall capturing capacity of DSO, more tellingly, the waveform capturing capacity of acquisition system of DSO.

2 Claims, 4 Drawing Sheets

METHOD FOR MEASURING THE WAVEFORM CAPTURE RATE OF A DIGITAL STORAGE OSCILLOSCOPE BASED ON AVERAGE DEAD TIME MEASUREMENT

FIELD OF THE INVENTION

This application claims priority under the Paris Convention to Chinese Patent Application No. 201510372830.1, Filed Jun. 30, 2015, the entirety of which is hereby incorporated by reference for all purposes as if fully set forth herein.

The present invention relates to digital storage oscilloscope (DSO), more particularly to a method for measuring the waveform capture rate (WRC) of a DSO based on average dead time measurement.

BACKGROUND OF THE INVENTION

Digital storage oscilloscope is increasingly used in time-domain measurement, and the waveform capture rate is an important indicator of performance for the data acquisition and processing of a DSO. Waveform capture rate can be defined as "the number of waveforms which an oscilloscope can capture and display in unit time", and usually be expressed as waveforms per second (wfms/s), it indicates the size of amount of information acquired and displayed by an acquisition system in unit time. A higher waveform capture rate indicates the stronger capacity of an oscilloscope for capturing accidental event.

FIG. 1 is a diagram of waveform acquiring and processing of a DSO. As shown in FIG. 1, since the microprocessor unit (MPU) of DSO will be involved in the processing of the acquired waveform data, a time interval between two acquisitions is formed, and the time interval is called as dead time, which is from the end of previous acquisition to the beginning of next acquisition. During dead time, the acquisition system of DSO will lose the information of waveform.

The novel parallel digital storage oscilloscope, also called as digital three-dimensional oscilloscope, differs from conventional digital storage oscilloscope. The first difference is what displayed on parallel DSO is three dimensional waveform information: time, amplitude, and amplitude distribution along with the time. The second difference is the acquisition and processing of waveform data and the operation of MPU are parallel, so the dead time is greatly reduced. Although the dead time is reduced in parallel DSO, no matter how short the dead time is, it still exists. For parallel DSO, which emphasizes the capture of waveform details, the waveform capture rate is also an important indicator of performance, it determines the capacity to capture the information of waveform. Therefore, it is very necessary to measure the waveform capture rate of a parallel DSO.

We have put forward a method for measuring the waveform capture rate of a DSO, which has been granted a patent on Jun. 1, 2011 with No. CN101281224B. The method is also called as "Double Pulses Measurement", and fills the gap of measuring the WCR of a DSO. However, with this method, only the transient waveform capture rate of a DSO can be measured, and the results just reflect the waveform capture rate at the moment of measurement.

On the basis of double pulse measurement, and considering the asymmetry of acquisition and the refreshing time of parallel DSO, the U.S. Patent Application Publication No. U.S. 2014/0188419 A1, filed by us on Oct. 18, 2013, entitled "Method for Measuring the Waveform Capture Rate of Parallel Digital Storage Oscilloscope", herein incorporated by reference, provides a step amplitude-frequency combined pulse measurement to measure the time for waveform acquisition and mapping $T_{map}$, the number of captured waveforms before LCD refreshing $W_{acq}$ and the dead time caused by LCD refreshing $T_{DDT}$, and then calculates the actual measured average waveform capture rate of a parallel DSO, according to the measured data, so that the waveform capture rate of a parallel DSO can be measured. The described "Method for Measuring the Waveform Capture Rate of Parallel Digital Storage Oscilloscope" has improved the accuracy of measuring the waveform capture rate, however, it is too many steps to proceed with. For example, when locating the position of dead time caused by LCD refreshing of Tektronix DPO4034, 27 step amplitude-frequency combined pulses are needed, the efficiency of measuring the waveform capture rate is comparatively low.

SUMMARY OF THE INVENTION

The present invention aims to overcome the deficiencies of prior art and provides method for measuring the waveform capture rate (WRC) of a DSO based on average dead time measurement, so that the waveform capture rate can be obtained more accurately with more efficiency.

To achieve these objectives, in accordance with the present invention, a method for measuring the waveform capture rate of a DSO based on average dead time measurement is provided, comprising the following steps:

S1: generating a ramp signal or symmetric triangular wave signal as a base signal, its lasting time is T, its difference between the maximum amplitude and the minimum amplitude is S;

S2: generating a trigger signal, the frequency g of which is higher than the nominal maximum waveform capture rate of a DSO under measurement;

S3: setting trigger parameters of the DSO according to the base signal and the trigger signal as edge trigger, normal trigger mode, and the trigger source is the input channel of the trigger signal; setting the horizontal scale of the DSO under the fastest real-time sampling rate or the given maximum waveform capture rate, the corresponding acquisition time is h; setting the display mode of the DSO as dot display and infinite persistence; setting the memory depth of the DSO as minimum;

S4: obtaining a plurality of test signals by delaying the base signal K times, the k th delay time is $\tau_k$, $\tau_{k+1} > \tau_k$, where k is a serial number of the delays, and $1 \le k \le K$; for each test signal, a plurality of dead times are obtained according to the following steps:

inputting the trigger signal and the test signal simultaneously to the DSO; under the action of the trigger signal, the DSO samples the test signal at maximum waveform capture rate; after the pre-set testing time $\tau_k + T$ passes, closing the trigger signal, and measuring the initial voltage of each captured waveform displayed on the DSO, where the waveform having the same slope belongs to one group, the initial voltage of each captured waveform is noted as $v_i^j$ along the sequence in vertical direction, where i is the group number of captured waveforms, the value scope of i is $1 \le i \le M$, M is the number of groups of captured waveforms, j indicates the j th captured waveform in the i th group of captured waveforms; then calculating the dead time between two adjacent captured waveforms according to the following equation:

$$d_i^{j,j+1} = \frac{(v_i^{j+1} - v_i^j)T}{MS} - h;$$

recording each dead time $d_i^{j,j+1}$ between two adjacent captured waveforms to obtain the plurality of dead times;

S5: calculating the average of the plurality of dead times of the k th signal to obtain a average dead time $D_k$;

then recording each average dead time of each test signal to obtain a collection of average dead times $D=\{D_1, D_2, \ldots, D_k, \ldots, D_K\}$, then calculating the average value $\overline{D}$ of all average dead times, according to the following equation:

$$\overline{D} = \frac{1}{K}\sum_{k=1}^{K} D_k;$$

S6: calculating the waveform capture rate W of the DSO according to the following equation:

$$\overline{W} = \frac{1}{\overline{D}+h}.$$

The objectives of the present invention are realized as follows:

The present invention comprises the following steps: first generating a ramp signal or symmetric triangular wave signal as a base signal, and a trigger signal, the frequency of which is higher than the nominal maximum waveform capture rate of the DSO under measurement; secondly, setting the parameters of the DSO for measuring; then obtaining a plurality of test signals by delaying the base signal K times with different delay time, for each test signal, inputting it and the trigger signal simultaneously to the DSO, under the action of the trigger signal, the DSO sampling the test signal at maximum waveform capture rate, and obtaining the initial voltage of each captured waveform along the sequence in vertical direction, calculating the dead time between two adjacent captured waveforms according to the their initial voltages, finally calculating the waveform capture rate based on average dead times.

The present invention proposes a method for measuring the average waveform capture rate based on the relationship between the waveform capture rate of system and dead time. Using a ramp signal or symmetric triangular wave signal, the waveform capture rate of a DSO can be calculated by measuring the average dead time. The present invention is simple and easy for use, and the waveform capture rate obtained can effectively reflect the overall capturing capacity of a DSO, more tellingly, the waveform capturing capacity of the acquisition system of a DSO.

BRIEF DESCRIPTION OF THE DRAWING

The above and other objectives, features and advantages of the present invention will be more apparent from the following detailed description taken in conjunction with the accompanying drawings, in which.

DETAILED DESCRIPTION OF THE PREFERRED EMBODIMENT

Figure 1:
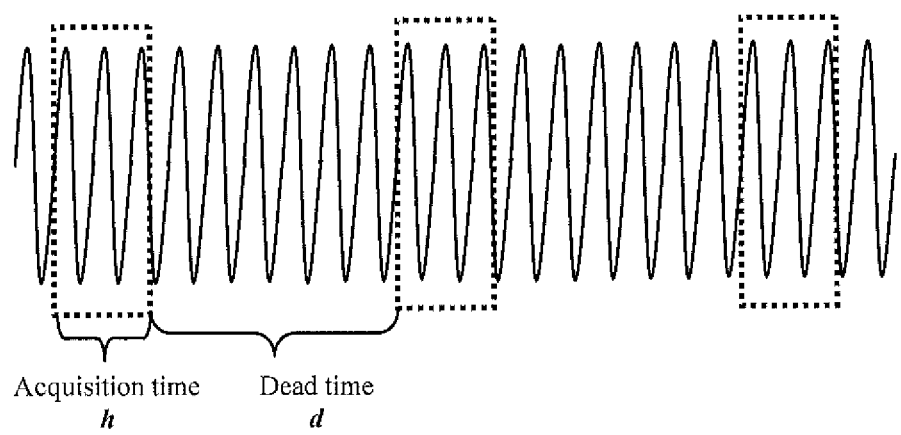
FIG. 1 is a diagram of waveform acquiring and processing of a DSO.

Hereinafter, preferred embodiments of the present invention will be described with reference to the accompanying drawings. It should be noted that the similar modules are designated by similar reference numerals although they are illustrated in different drawings. Also, in the following description, a detailed description of known functions and configurations incorporated herein will be omitted when it may obscure the subject matter of the present invention.

Embodiments

Figure 2:
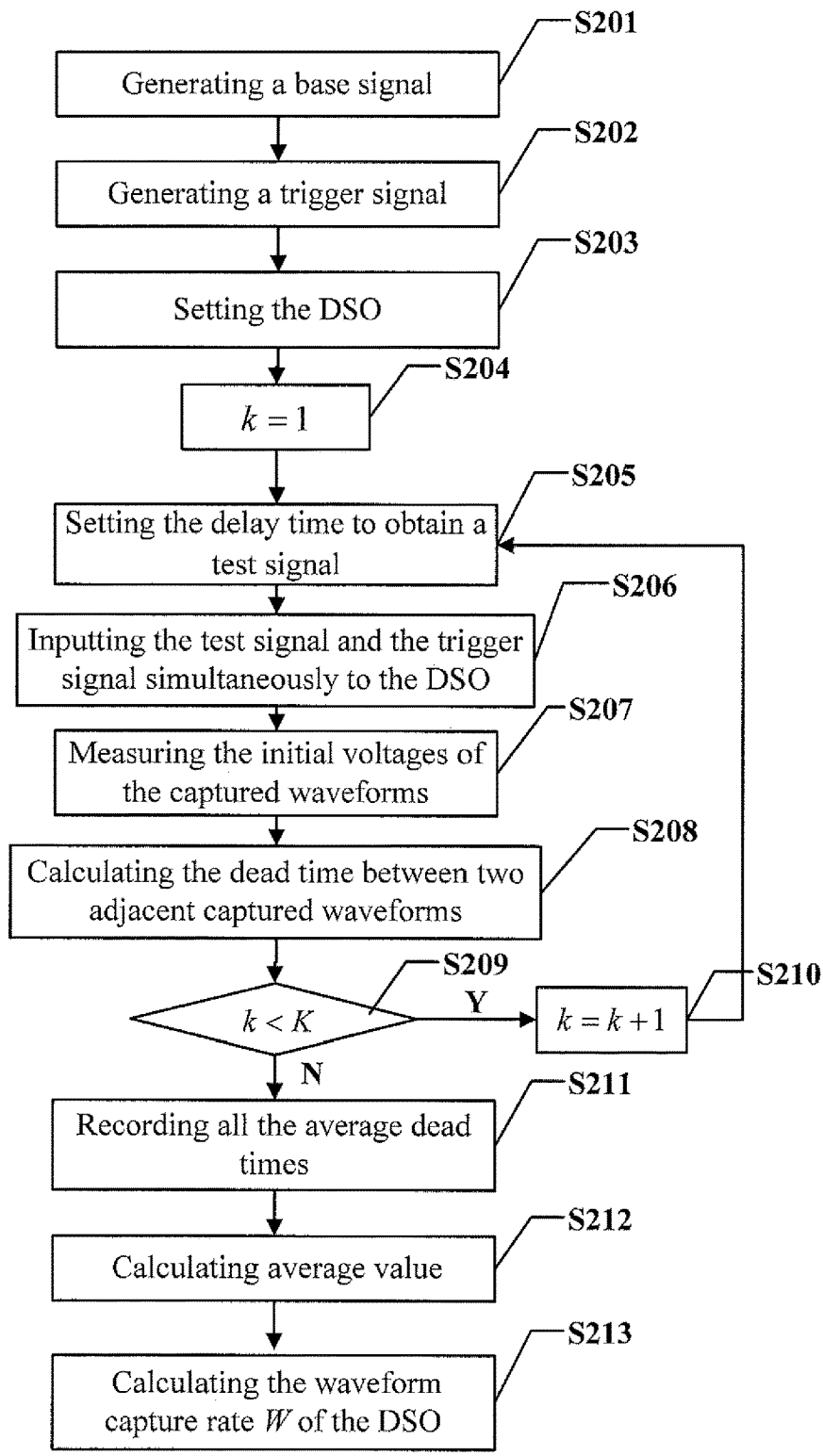
FIG. 2 is a flow chart of measuring the waveform capture rate based on average dead time measurement according to one embodiment of the present invention.

FIG. 2 is a flow chart of measuring the waveform capture rate based on average dead time measurement according to one embodiment of the present invention. As shown in FIG. 2, the method for measuring the waveform capture rate of a DSO based on average dead time measurement comprises the following concrete steps:

S201: Generating a base signal

Figure 3:
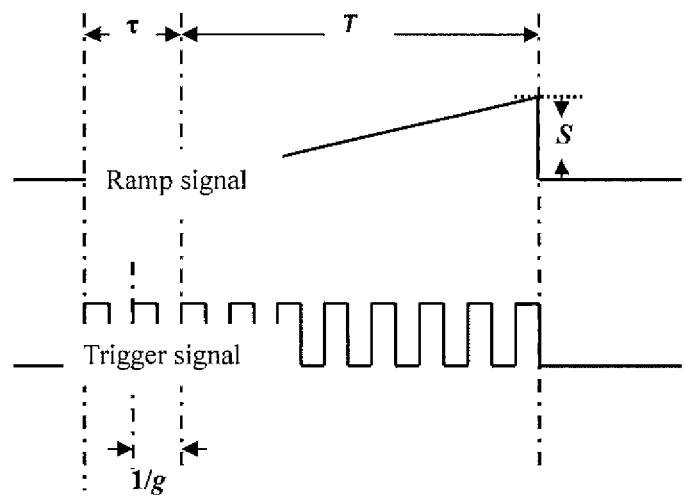
FIG. 3 is a timing diagram of a ramp signal and a trigger signal according to one embodiment of the present invention.
Figure 4:
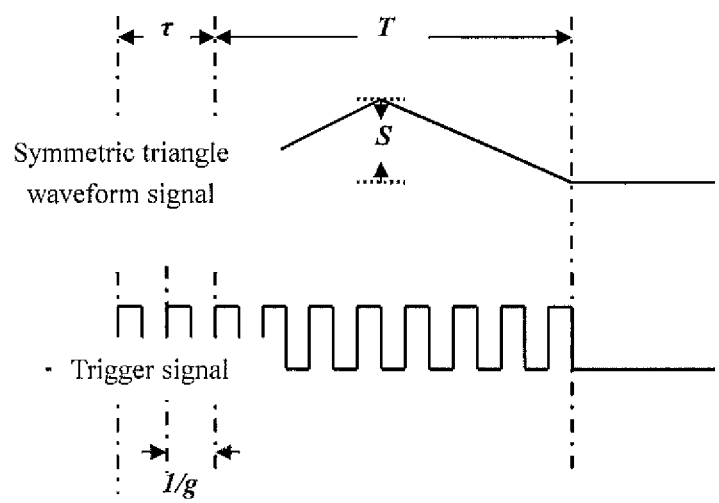
FIG. 4 is a timing diagram of a symmetric triangle waveform signal and a trigger signal according to one embodiment of the present invention.

The base signal used in present invention is a signal with linear variation of voltage amplitude. For example, the ramp signal, as shown in FIG. 3, the voltage amplitude of which rises or falls linearly, or divides into two linear variation signal, or the symmetric triangular waveform signal, as shown in FIG. 4, the voltage amplitude of which rises linearly first, then falls linearly, and the slope of the two sections equal in value but opposite in sign. The duration time of the base signal is T, and its difference between the maximum amplitude and the minimum amplitude is S;

S202: Generating a trigger signal

The frequency g of the trigger signal is higher than the nominal maximum waveform capture rate of a DSO under measurement;

S203: Setting the DSO

Figure 5:
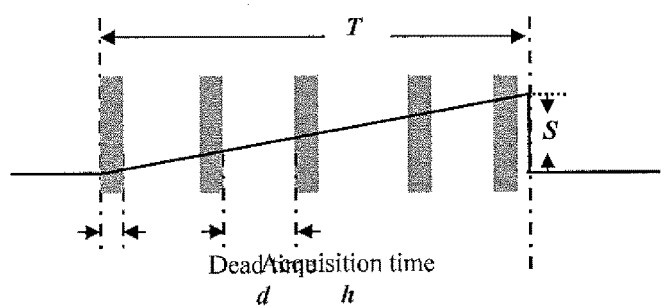
FIG. 5 is a diagram of the acquisition of test signal according to one embodiment of the present invention.

According to the base signal and the trigger signal, trigger parameters of the DSO are set as edge trigger, normal trigger mode, and the trigger source is the input channel of the trigger signal; and the horizontal scale of the DSO is set under the fastest real-time sampling rate or the given maximum waveform capture rate, the corresponding capture time is h; the display mode of the DSO is set as dot display and infinite persistence; and the memory depth of the DSO is set as minimum. In addition, the vertical scale is adjusted to an appropriate sensitivity range according to the amplitude of the test signal, so that the test signal can be observed clearly;

S204: Letting the serial number k=1;

S205: Setting the delay time to obtain a test signal;

The delay time of the k th test signal is set as $\tau_k$, $\tau_k > \tau_{k-1}$. Since the delay time determines the effective time scope of measurement, the actual delay time is set according to the requirement of the actual measurement. And the k th test signal is obtained by delaying the base signal for delay time $\tau_k$;

S206: Inputting the trigger signal and the test signal simultaneously to the DSO The input channels of the trigger signal and the test signal is selected in light of actual condition of the DSO. Under the action of the trigger signal, the DSO samples the test signal at maximum waveform capture rate. As shown in FIG. 5, The DSO samples the test signal within the acquire time, and the initial voltage, i.e. the voltage at the start point of each captured waveform is different due to the linear rise of voltage amplitude of the test signal, so the dead time can be calculated through initial voltages;

S207: Measuring the initial voltages of the captured waveforms

Figure 6:
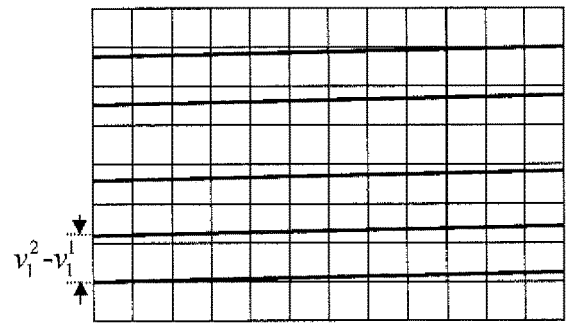
FIG. 6 is a diagram of captured waveforms of a ramp signal according to one embodiment of the present invention.
Figure 7:
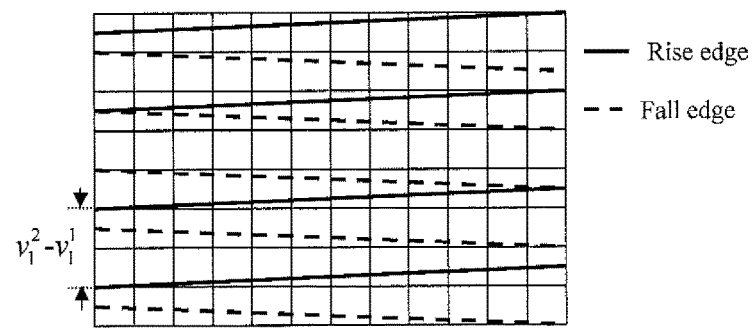
FIG. 7 is a diagram of captured waveforms of a symmetric triangular wave signal according to one embodiment of the present invention.

Timing starts when the trigger signal and the test signal are inputted simultaneously to the DSO; After the pre-set testing time $\tau_k+T$ passes, the trigger signal will be closed, then we can measure the initial voltage, i.e. the voltage at the start point of each captured waveform displayed on the DSO, where the waveform having the same slope belongs to one group, the number of waveforms of each group is greater than 1, the initial voltage of each captured waveform is noted as $v_i^j$ along the sequence in vertical direction, where i is the group number of captured waveforms, the value scope of i is $1 \leq i \leq M$, M is the number of groups of captured waveforms, j indicates the j th captured waveform in the i th group of captured waveforms;

FIG. 6 is a diagram of captured waveforms of a ramp signal, FIG. 7 is a diagram of captured waveforms of a symmetric triangular wave signal. As shown in FIG. 6 and FIG. 7, the captured waveforms are shown as a series of parallel lines on the screen due to the linear variation of voltage amplitude of the test signal. Ramp signal is a linear variation signal, thus the captured waveforms are a group of parallel lines. The symmetric triangle signal consists of two linear variation signals, so the capture waveforms is two groups of parallel lines. Therefore, in present invention, M=1 or M=2. If the base signal is a symmetric triangle signal, a small triangle waveform may appear among the captured waveforms, Nevertheless, as the small triangle waveform appears once only, it will not affect the calculation of dead time;

S208: Calculating the dead time between two adjacent captured waveforms;

According to the initial voltages of two adjacent captured waveforms, the dead time between the two adjacent captured waveforms can be calculated, The calculation formula of the capture cycle $t_i^j$ of the j th captured waveform is:

$$t_i^j = d_i^{j,j+1} + h = \frac{v_i^{j+1} - v_i^j}{S/(T/M)} = \frac{(v_i^{j+1} - v_i^j)T}{MS};$$

The dead time $d_i^{j,j+1}$ calculation formula of two adjacent captured waveforms can be derived based on the above formula as:

$$d_i^{j,j+1} = \frac{(v_i^{j+1} - v_i^j)T}{MS} - h;$$

the average dead time $D_k$ is obtained by calculating the average of the plurality of dead times of the k th signal;

S209: Determining whether k<K, where K stands for maximum test times, i.e the number of test signals, and if so, going to step S210; otherwise, step S211;

S210: Letting k=k+1, returning to step S205;

S211: Recording all the average dead times;

Each test signal corresponds to a plurality of dead times and different test signal may result in different number of dead time. Recording all the average dead times acquired from K test signals to obtain a collection of dead times $D=\{D_1, D_2, \ldots, D_k, \ldots, D_K\}$, where K is the total number of average dead times, k is the serial number of the collection of dead times, $D_k$ is the k th dead time of the collection of dead times, S212: Calculating average value;

The calculation formula for average value $\overline{D}$ of all test signals is:

$$\overline{D} = \frac{1}{K}\sum_{k=1}^{K}D_k;$$

S213: Calculating the waveform capture rate W of the DSO;

According to the average value $\overline{D}$ calculated from step S212, the calculation formula for average capture rate W of the DSO is:

$$W = \frac{1}{\overline{D}+h}.$$

Measuring Example

In the measuring, the programmable arbitrary waveform generator is AWG5014B from the Agilent, its sample rate is 1.2 Gs/S, the vertical resolution is 14-bits and the memory depth is 32 M. The ramp signal is generated by programming it.

In accordance with the present invention, the measured WCRs of 4 typical DSOs are shown in Table 1.

TABLE 1

|  | DPO4054B | WaveRunner 104Xi-A | DPO7254C | DS4024 |
| --- | --- | --- | --- | --- |
| Manufacturer | Tektronic(USA) | LeCroy(USA) | Tektronic(USA) | Rigol(China) |
| Nominal WCR | >50,000 wfms/s | 8,000 wfms/s | >310,000 wfms/s | 110,000 wfms/s |
| Measured WCR | 33,333 wfms/s | 7,400 wfms/s | 330,578 wfms/s | 90,000 wfms/s |

From the Table 1, it can be seen that measured WCRs of DPO4064B, WaveRunner 104Xi-A, and DS4024 are lower than their nominal WCR respectively, And only DPO7254C conforms to its nominal WCR.

While illustrative embodiments of the invention have been described above, it is, of course, understood that various modifications will be apparent to those of ordinary skill in the art. Such modifications are within the spirit and scope of the invention, which is limited and defined only by the appended claims.

What is claimed is:

1. A method for measuring the waveform capture rate of a digital storage oscillator (DSO) based on average dead time measurement, the method comprising:
    generating a ramp signal or symmetric triangular wave signal as a base signal, the lasting time of the base signal being T, and a difference between the maximum amplitude of the base signal and the minimum amplitude of the base signal being S;
    generating a trigger signal, the frequency g of which is higher than the nominal maximum waveform capture rate of a DSO under measurement;
    setting trigger parameters of the DSO under measurement according to the base signal and the trigger signal as edge trigger, normal trigger mode, and the trigger source is the input channel of the trigger signal;
    setting the horizontal scale of the DSO under measurement under the fastest real-time sampling rate or the given maximum waveform capture rate, the corresponding acquisition time being h;
    setting the display mode of the DSO under measurement as dot display and infinite persistence;
    setting the memory depth of the DSO under measurement as minimum;
    obtaining a plurality of test signals by delaying the base signal K times, the k th delay time being $\tau_k$, $\tau_{k+1} > \tau_k$, where k is a serial number of the delays, and $1 \leq k \leq K$, wherein for each test signal, a plurality of dead times are obtained according to the following steps:
        inputting the trigger signal and the test signal simultaneously to the DSO, wherein under the action of the trigger signal, the DSO under measurement samples the test signal at the maximum waveform capture rate;
        after the pre-set testing time $\tau_k + T$ passes, closing the trigger signal, and measuring the initial voltage of each captured waveform displayed on the DSO under measurement, where the waveform having the same slope belongs to one group, the initial voltage of each captured waveform is noted as $v_i^j$ along the sequence in vertical direction, where i is the group number of captured waveforms, the value scope of i is $1 \leq i \leq M$, M is the number of groups of captured waveforms, j indicates the j th captured waveform in the i th group of captured waveforms, wherein the initial voltage is the voltage at the start point of each captured waveform displayed on the DSO under measurement;
    calculating the dead time between two adjacent captured waveforms according to the following equation:

$$d_i^{j,j+1} = \frac{(v_i^{j+1} - v_i^j)T}{MS} - h;$$

recording each dead time $d_i^{j,j+1}$ between the two adjacent captured waveforms to obtain the plurality of dead times;
    calculating the average of the plurality of dead times of the k th signal to obtain an average dead time $D_k$;
    recording each average dead time of each test signal to obtain a collection of average dead times D={$D_1$, $D_2$, ..., $D_k$, ..., $D_K$}, then calculating the average value $\overline{D}$ of all average dead times, according to the following equation:

$$\overline{D} = \frac{1}{K}\sum_{k=1}^{K} D_k;$$

and
    obtaining, based on the average value of all the average dead times, the waveform capture rate of the DSO, the obtaining including calculating the waveform capture rate W of the DSO under measurement according to the following equation:

$$\overline{W} = \frac{1}{\overline{D} + h}.$$

2. A method comprising:
    generating a ramp signal or symmetric triangular wave signal as a base signal;
    generating a trigger signal, the frequency of which is higher than the nominal maximum waveform capture rate of a DSO;
    setting trigger parameters of the DSO according to the base signal and the trigger signal as edge trigger, normal trigger mode, and the trigger source is the input channel of the trigger signal;
    setting the horizontal scale of the DSO under the fastest real-time sampling rate or the given maximum waveform capture rate;
    setting the display mode of the DSO as dot display and infinite persistence;
    setting the memory depth of the DSO as minimum;
    obtaining a plurality of test signals by delaying the base signal, wherein for each test signal, a plurality of dead times are obtained;
    closing the trigger signal, and measuring the initial voltage of each captured waveform displayed on the DSO under measurement, wherein the initial voltage is the voltage at the start point of each captured waveform displayed on the DSO under measurement
    calculating the dead time between two adjacent captured waveforms;
    recording each dead time between the two adjacent captured waveforms to obtain the plurality of dead times;
    calculating the average of the plurality of dead times to obtain an average dead time;
    recording each average dead time of each test signal to obtain a collection of average dead times;
    calculating the average value of all average dead times; and
    obtaining, based on the average value of all the average dead times, the waveform capture rate of the DSO, the obtaining including calculating the waveform capture rate of the DSO.

* * * * *